(12) United States Patent
Schnabel et al.

(10) Patent No.: US 6,621,709 B1
(45) Date of Patent: Sep. 16, 2003

(54) ELECTRONICS ASSEMBLY

(75) Inventors: John David Schnabel, Fareham (GB); Stephen David Sparkes, Farnborough (GB)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/166,518

(22) Filed: Jun. 10, 2002

(51) Int. Cl.[7] ................................................. H05K 5/00
(52) U.S. Cl. ........................ 361/756; 361/802; 361/686; 361/727; 439/377; 439/61; 439/64
(58) Field of Search ................................. 361/756, 727, 361/741, 686, 802, 752, 724, 714, 797, 800, 730; 439/377, 61, 64, 948

(56) References Cited

U.S. PATENT DOCUMENTS 5,214,572 A * 5/1993 Cosimano et al. .......... 361/802
5,460,441 A * 10/1995 Hastings et al. ............ 312/298

* cited by examiner

*Primary Examiner*—David Martin
*Assistant Examiner*—Hung Bui
(74) *Attorney, Agent, or Firm*—Meyertons, Hood, Kivlin, Kowert, & Goetzel, P.C.; B. Noël Kivlin (57) ABSTRACT

An electronics assembly comprises: (i) a frame (1); and (ii) a motherboard (16) that is removable from the frame. One or more motherboards (20) extend in a plane generally perpendicular to the plane of the motherboard; and a number of elongate guides (24) are provided for the daughterboards to enable each daughterboard to be moved toward the motherboard into engagement therewith and away from the motherboard out of engagement therefrom. The motherboard (16) has at least one location element (32) thereon, which can engage one of the elongate guides (24) in order to locate the guides and the motherboard with respect to one another. This assembly enables accurate positioning of the daughterboards and the motherboard for forming electrical connections between them even where large tolerances are present in other parts of the assembly.

23 Claims, 6 Drawing Sheets

ELECTRONICS ASSEMBLY

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting frame that houses a motherboard or backplane and a number of daughterboards or module cards that extend in planes generally perpendicular to the plane of the motherboard and which are connected to the motherboard by connectors, e.g. high density connectors, so that the daughterboards can simply be located on guides and pushed toward the motherboard in order to connect them to it.

In addition, the motherboard may need to be removed for general maintenance purposes, upgrading or the like and so the frame of the assembly will normally provide for removal of the motherboard therefrom and re-insertion therein.

One problem that can be encountered is in alignment of the daughterboards and the motherboard after the boards have been removed and replaced. For example, it is quite possible for the positional tolerance of the motherboard within the frame of the assembly, and for the tolerance of the guides for the daughterboards within the frame to be relatively large. In addition, parts of the frame itself can flex due to the forces applied to it during handling. All these tolerances add to one another, with the result that it is possible for the variation in the alignment between the connectors on the daughterboards and those on the motherboard to exceed the maximum acceptable positional deviation for the electrical connectors.

SUMMARY OF THE INVENTION

According to one aspect the present invention provides an electronics assembly which comprises:
(i) a frame;
(ii) a motherboard that is removable from the frame;
(iii) one or more daughterboards that extend in a plane generally perpendicular to the plane of the motherboard; and
(iv) a plurality of elongate guides for the daughterboards to enable each daughterboard to be moved toward the motherboard into engagement therewith and away from the motherboard out of engagement therefrom;
wherein the motherboard has at least one location element thereon, which can engage one of the elongate guides in order to locate the guides and the motherboard with respect to one another.

By locating the motherboard directly with the card guides for the daughterboards it is possible to decrease misalignment of the connectors on the motherboard and on the daughterboards significantly since any misalignment of the motherboard within the assembly frame and any slight flexing of the frame that might cause those parts thereof that support the card guides to become displaced can be ignored insofar as alignment of the motherboard and daughterboard connectors is concerned.

The problems of misalignment are particularly severe in assemblies where the motherboard can be removed from, or inserted in, the frame by movement in its own plane. For example the motherboard may be located in, and fixed to, a substantially tray-shaped holder that can be slid into and out of the frame via an elongate slot. For ease of assembly and disassembly it is often desirable to dispense with screw-fixing in such circumstances and instead to rely on a stop that abuts the tray-shaped holder to locate the motherboard correctly within the frame and some form of manually engageable fixing arrangement to fix the motherboard and holder in place. Such an arrangement has the disadvantage that the potential degree of misalignment between the motherboard and the daughterboards is substantially greater than when employing screw fixings and alignment of the daughterboards with the motherboard can be impossible to achieve to the tolerance required by the connectors for correct mating. According to the invention, however, the relevant card guides themselves effectively provide a stop for limiting insertion of the motherboard.

In such an arrangement the location elements on the motherboard may stand up from the printed circuit board forming the motherboard so that they can engage their corresponding card guides but the guides will allow the motherboard to be removed from, or inserted in, the frame without inadvertently hitting any other components on the motherboard.

The assembly will normally contain an array of daughterboards each located between a pair of card guides. It is not necessary for all the card guides to extend sufficiently close to the motherboard to engage a location element, but only for a minimum of one and preferably of two card guides which are in positions corresponding to the positions of the location elements to extend that closely to the motherboard while the other card guides may terminate a greater distance away. Clearly it is desirable if the positions of the location elements on the motherboard are separated by a significant fraction of the overall dimensions of the motherboard, for example by at least ⅓ or at least ½ the overall dimensions in order to provide improved resistance to relative rotation of the motherboard and the card guides about an axis normal to the plane of the motherboard. Normally, the daughterboards will all be located in the same region of the frame, for example in a single sub-enclosure, so that if the frame as a whole is subjected to any strain by insertion of the motherboard into engagement with the card guides, all the card guides will move together as the frame flexes slightly and so will stay in alignment with the motherboard. If, however, daughterboards are provided in different sub-enclosures in the frame, it may be necessary for additional location elements for the daughterboards in each sub-enclosure to be provided.

The location elements on the motherboard may, for example, be in the form of protuberances, for instance pins, that become located in recesses in the corresponding card guides when the motherboard is in position. It is not necessary for each location element to prevent relative movement of the motherboard and the card guides in all directions in the plane of the motherboard, but instead, engagement of one location element on the motherboard with the corresponding card guide may prevent relative movement of the motherboard and the guides in a direction perpendicular to the direction in which movement is prevented by engagement of the other location element and its corresponding guide. In one example, engagement of one location element on the motherboard with its corresponding card guide may prevent relative movement of the motherboard and the corresponding card guide in two orthogonal directions (in the plane of the motherboard) while engagement of the other location element with its guide need only prevent movement of the motherboard in one direction, that is to say, engagement of the other location element with its card guide simply needs to prevent any rotation of the motherboard about the first location element.

The invention is applicable to any assembly comprising a motherboard and a number of daughterboards or module cards irrespective of their orientation, for example in a conventional orientation in which the motherboard is arranged in a vertical plane at the back of a cabinet and the daughterboards are arranged, either in a vertical or horizontal plane, so that they can be removed or inserted in a horizontal direction from the front of the cabinet. The invention is also applicable to a new design of assembly in which the motherboard is located within the assembly frame substantially horizontally, especially beneath the daughterboards, and the daughterboards are arranged in an array in vertical planes. In such a case the assembly may need to be removed from the cabinet in one piece in order to remove the daughterboards, in which case it can be supported on telescopic sliders.

According to another aspect, the present invention provides a frame for an electronics assembly which comprises:

(i) a location in which a planar motherboard can be received; and (ii) a plurality of guides that extend in a direction generally normal to the plane of the motherboard when it is received in the frame in order to enable a plurality of daughterboards to be located in the frame in engagement with the motherboard, at least one of the guides having a location element thereon that can engage a corresponding location element on a motherboard in order to locate the guides and the motherboard with respect to one another.

According to yet another aspect, the invention provides a method of installing a motherboard in a frame for an electronics assembly comprising a plurality of guides for daughterboards, the guides extending generally normal to the plane of the motherboard, which method comprises:

(i) sliding the motherboard into the frame; and (ii) causing a location element on the motherboard to engage a corresponding location element on at least one of the guides in order to locate the guides and the motherboard with respect to one another.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Figure 1:
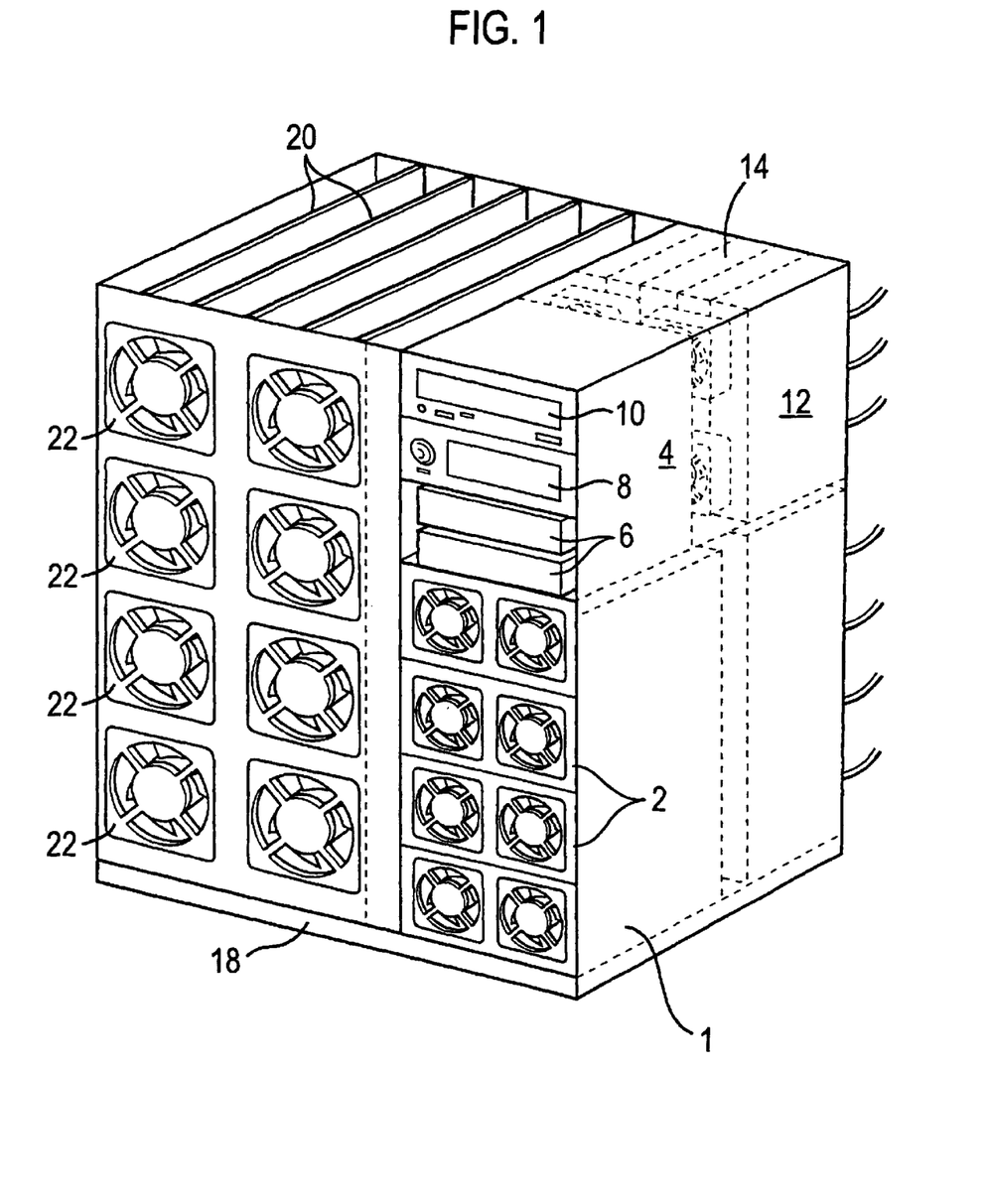
FIG. 1 is a schematic isometric view of an assembly according to the present invention.

Referring now to the drawings, in which like reference numerals are used to designate corresponding elements, FIG. 1 shows an assembly according to one embodiment of the invention that forms part of a server that may be employed for a number of services, for example as part of a local area network (LAN) and is designed as a nineteen inch rack to be located in an electronics cabinet. Other sizes of rack, e.g. twenty three inch or metric racks may be also employed.

The assembly comprises a frame 1 in which the various components are located. The frame 1 contains a number of power modules 2 for converting mains a.c. power to an appropriate d.c. voltage, a part 4 that contains hard disk drives 6, a tape drive 8 and a CD-ROM or digital video disc drive 10, and a part 12 that contains a number of I/O cards 14. A motherboard 16 is located within the frame in a horizontal plane at the bottom of the frame in a tray-shaped holder 18, and a number of daughterboards 20 are arranged next to each other in a vertical plane above the motherboard 16 and to the side of the power modules 2. The daughterboards may serve any of a number of purposes, for example having CPUs or may be repeater boards etc. Finally, a number of fans 22 are provided in an array at the front of the frame in order to blow air through the assembly between the daughterboards 20 for cooling.

Figure 2:
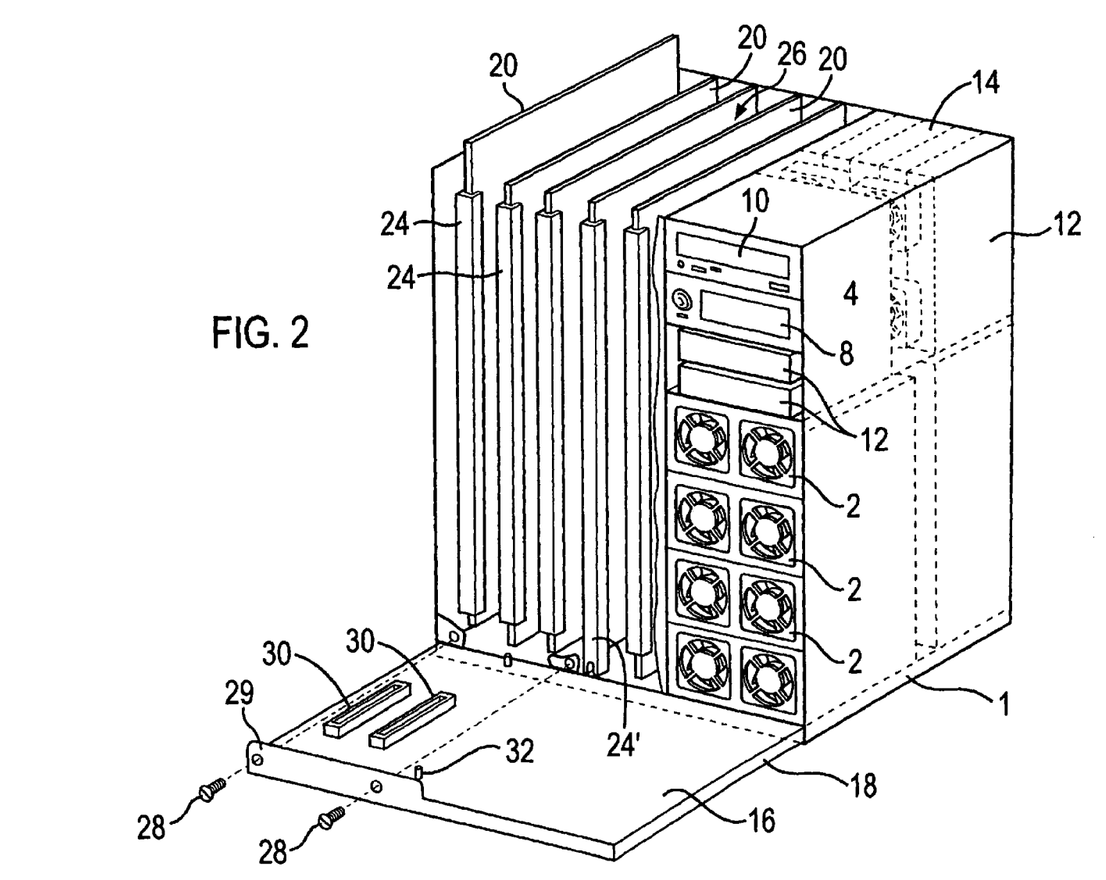
FIG. 2 is a schematic view corresponding to FIG. 1 but with the daughterboards removed and the motherboard partly removed.

The daughterboards 20 are each located between a pair of elongate card guides 24 (FIG. 2) that extend normal to the plane of the motherboard 16 between the motherboard and openings 26 at the top surface of the frame 1 for insertion of the daughterboards. The card guides 24 terminate at their lower end some distance short of the motherboard in order to allow sufficient clearance for any components that are located on the motherboard to pass beneath the guides as the motherboard is removed from the frame. The card guides may be formed from metal, or from a suitable, relatively rigid, plastics material such as a polyamide, and have generally "U"-shaped cross-sections into which the edges of the daughterboards 20 can be slotted.

Any of the electronics components of the assembly may need to be removed and replaced from time to time, for example for repair or for upgrading, and in order to do this the daughterboards 20 can simply be lifted out of the frame through the openings 26. If the motherboard 16 needs attention, the daughterboards must first be removed, and then the motherboard may be removed by sliding it horizontally out of the frame 1 in its own plane after first removing screws 28. A new motherboard may then be inserted into the frame 1 and the daughterboards 20 re-inserted into frame along the card guides 24 into engagement with the motherboard via connectors 30 on the motherboard 16 and corresponding connectors (not shown) on the daughterboards.

In order for the connectors on the daughterboards 20 to mate correctly with the connectors 30 on the motherboard 16, the connectors should not be misaligned with one another or otherwise a poor electrical connection can result, or even damage the connectors. This tolerance required between the connectors can often be tighter than can be achieved if the tolerance between the connectors is determined by the total tolerance of the connectors 30 on the motherboard 16, the motherboard 16 within the frame 1, the position of the daughterboard card guides 24 within the frame 1, the location of the daughterboards 20 within the guides 24, the position of the electrical connectors on the daughterboards, and any slight torsion or other strain in the frame 1.

Figure 4:
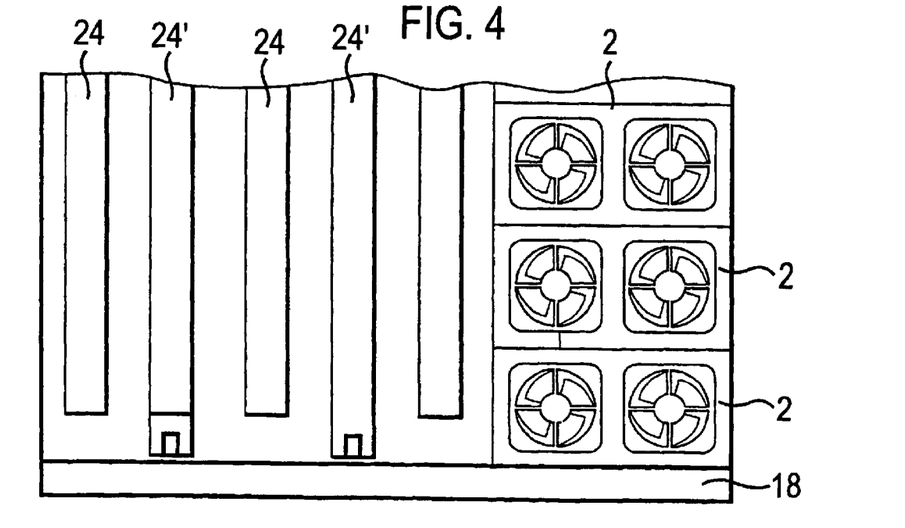
FIG. 4 is a side elevation of the assembly shown in FIGS. 1 and 2.

Instead of relying on the position of the motherboard and the daughterboard card guides with respect to the frame in order to set the alignment of the motherboard and daughterboard connectors, two of the card guides 24' are longer than the remaining card guides by a few centimetres as shown in FIG. 4 so that they end at their lowermost ends only a few millimetres above the plane of the motherboard, and these card guides 24' together with the motherboard are provided with location elements that engage each other directly so that the alignment of the connectors 30 on the motherboard 16 and those on the daughterboards is determined by the tolerance of the location of the connectors on their respective boards and of the location elements on the motherboard and on the card guides respectively.

Figure 5:
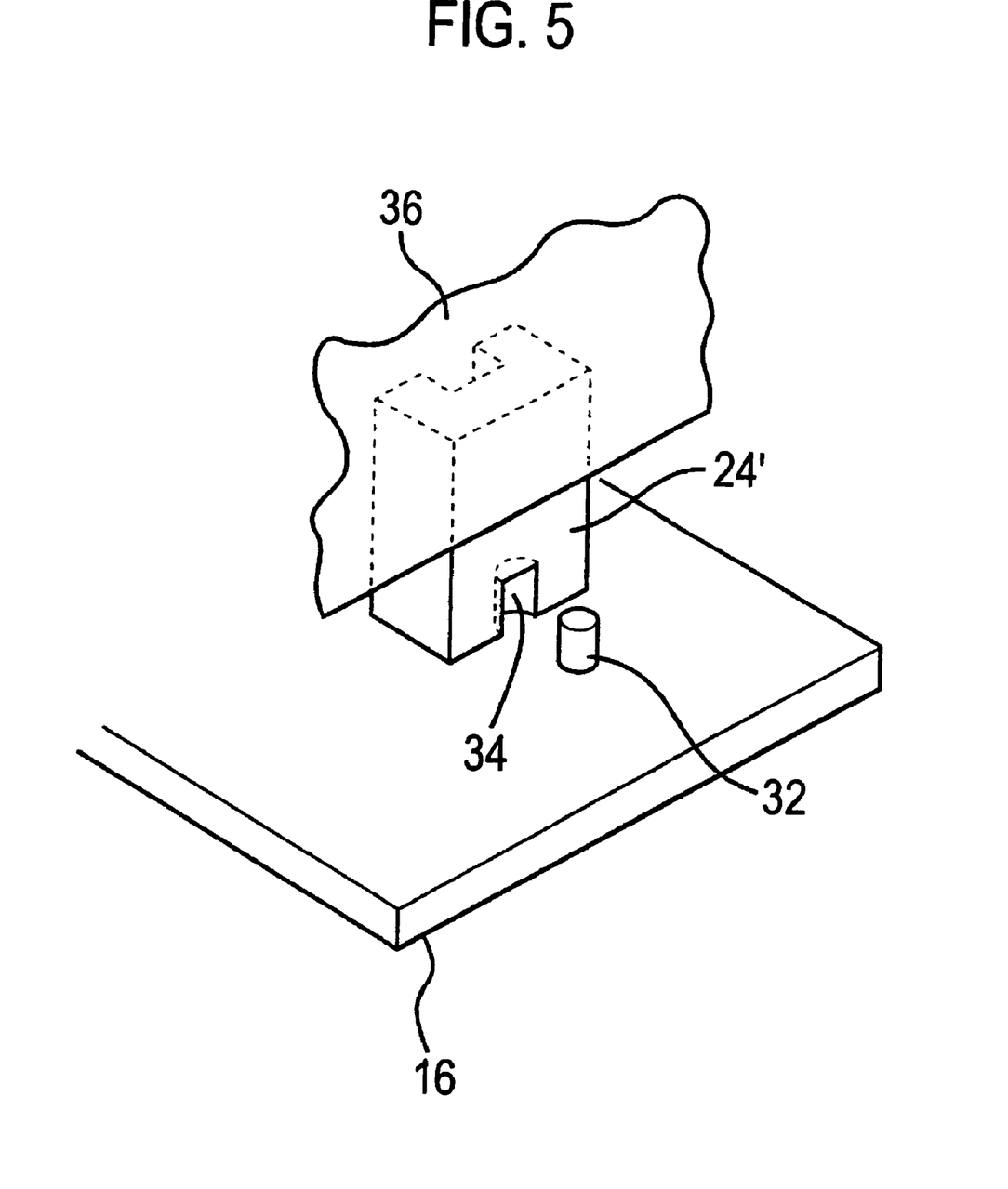
FIG. 5 is a view of the motherboard and a card guide in greater detail.

The location elements on the motherboard are each in the form of a protuberance or pin 32 that stands up from the surface of the motherboard 16 by a distance greater than the clearance of the two card guides 24, and the motherboard surface, and the lower end region of each of the two card guides 24' is provided with a generally cup-shaped recess 34 that can receive one of the pins 32, when the motherboard 16 is inserted into the frame 1 as shown in FIG. 5.

Figures 6A, 6B:
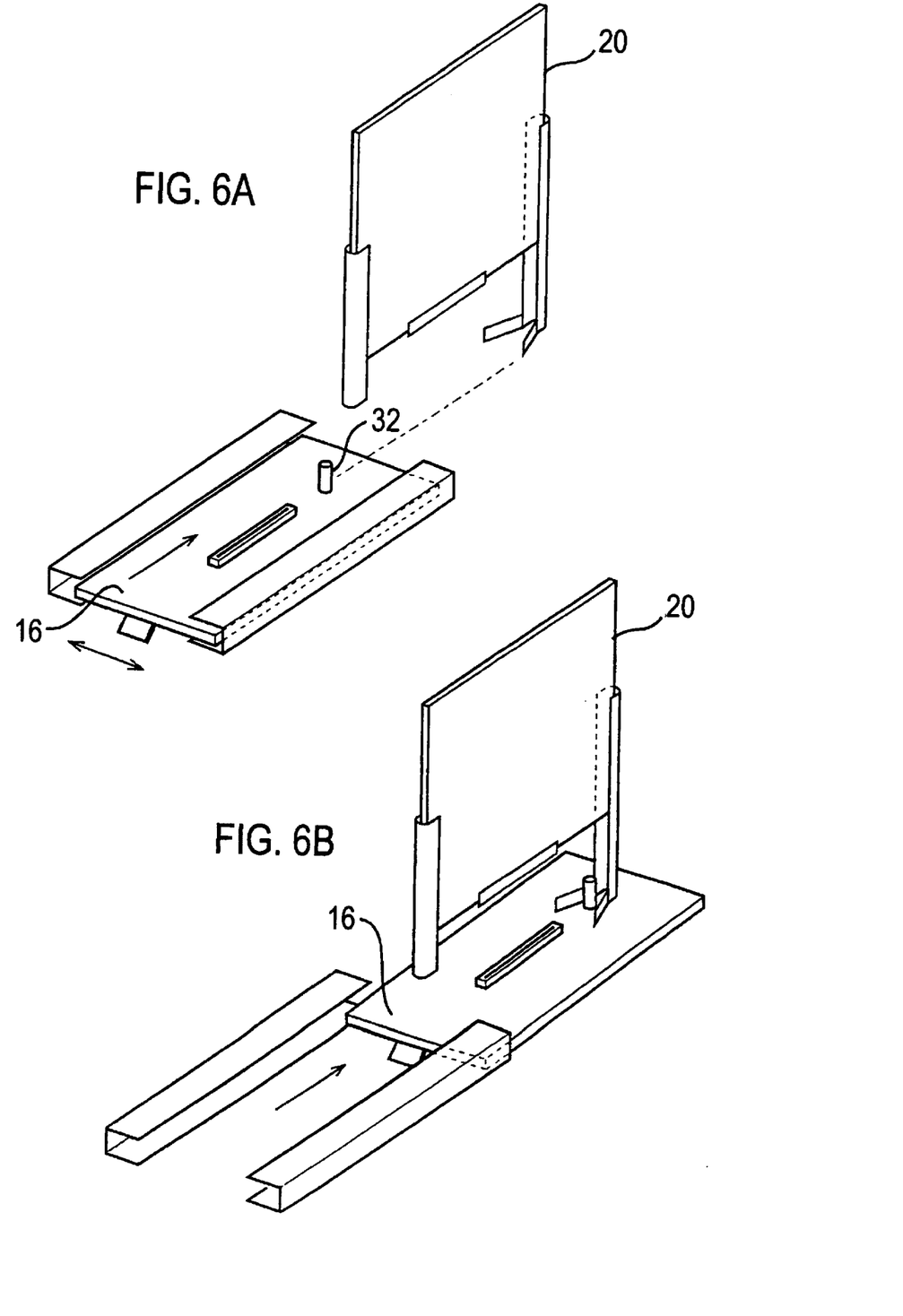
FIG. 6 and FIG. 7 show schematically two alternative modes of operation

If desired, the protuberance 32 and recess 34 can taper in the direction of insertion of the motherboard into the frame in order to provide some degree of lateral guidance for location of the motherboard and the daughterboard card guides.

Where lateral guidance is provided for insertion of the motherboard, and a degree of relative movement between the motherboards and the daughterboard card guides is expected, either the motherboard or the card guides may move with respect to the frame. For example, as shown in FIGS. 6a and 6b the daughterboard card guides 24 are fixed with respect to the frame 1 and the motherboard 16 is allowed to move laterally with respect to the frame in order to align itself with the card guides. In this case elongated screw holes 29 will be provided in the motherboard holder or in the frame for receiving screws 28 when the motherboard is finally located in the frame.

Figure 7A:
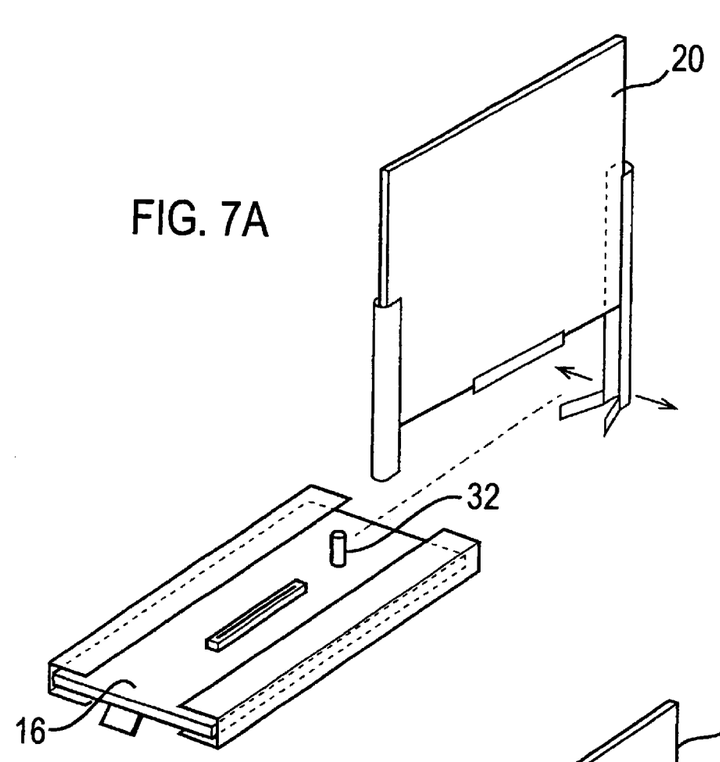
Figure 7B:
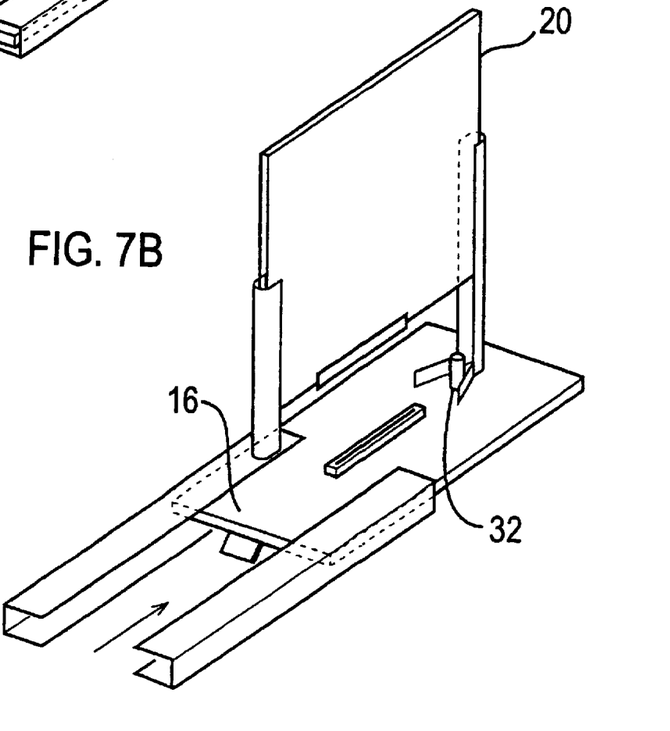

Alternatively, as shown in FIGS. 7a and 7b, the card guides may move laterally within the frame in order to become aligned with the motherboard if the motherboard is constrained not to move laterally within the frame 1. In practice, it may not be clear which of these alternatives is used: For example both the motherboard 16 and the card guides 24 may be allowed to move slightly with respect to the frame, or alternatively both the motherboard 16 and the card guides 24 may have relatively tight tolerances with respect to the frame 1, and the required relative lateral movement between the motherboard and the card guides may be provided by torsion of various parts of the frame.

Figure 3:
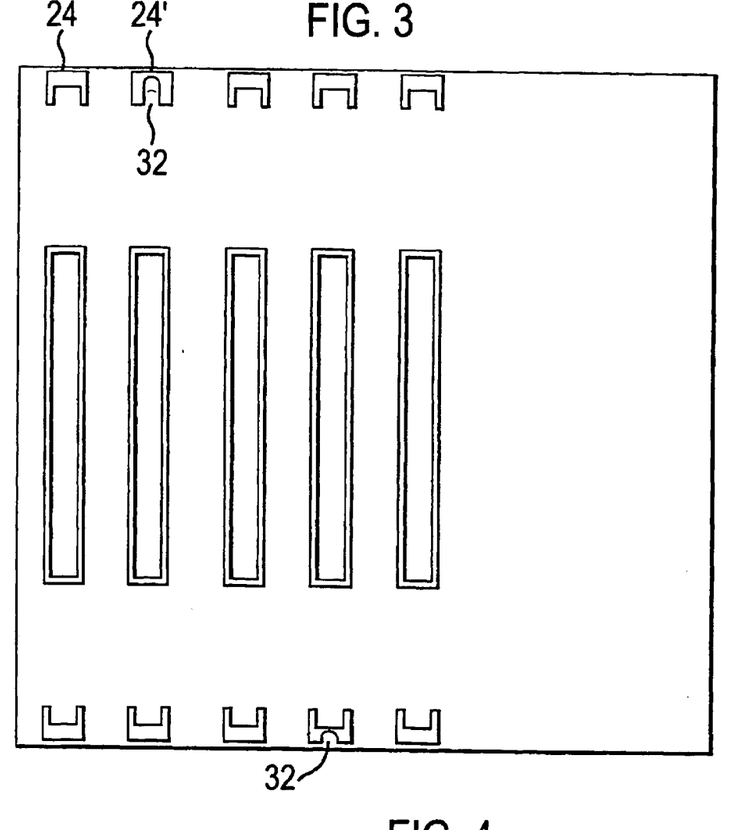
FIG. 3 is a top plan view of the motherboard shown in FIG. 2.

It is possible for the location elements on both the card guides 24', and both the location elements on the motherboard 16 to prevent relative movement between the motherboard and the card guides in two orthogonal directions (e.g. in the direction of insertion of the motherboard 16 into the frame 1 and in a direction perpendicular thereto), but this is not absolutely necessary. Recess 34 on one of the card guides 24' nearest the front of the frame 1 is arranged so that the corresponding pin 34 on the motherboard 16 will abut the internal apex thereof so that relative movement between the motherboard and the card guide is prevented in two orthogonal directions, while the recess 34 on the other card guide 24' is arranged so that the corresponding pin 32 on the motherboard is received in the recess but does not abut the internal apex of the recess. In this arrangement the card guide 24' and pin 32 nearest the front of the frame 1 prevents relative movement between the motherboard and the card guides both in the direction of insertion of the mother board and also laterally, while the other end guide 24' and pin 32 only prevent relative movement in a lateral direction (shown by the arrow in FIG. 3). In other words, the card guide 24' and pin 32 farthest from the front of the frame simply resists relative rotation of the motherboard and the frame about the card guide 24' and pin 32 nearest to the front of the frame 1.

Normally, where location elements are provided on one of the front and one of the rear card guides 24, the two card guides on which the location elements are provided must be laterally offset in order to allow any location protuberance 32 on the motherboard corresponding to a rear card guide to pass the location element on the front card guide. If, however, the location element on the front end guide is required only to prevent relative movement in the lateral direction, it may be designed to allow any protuberance at the rear of the motherboard to pass through it when the motherboard is inserted, in which case location elements could be provided on both card guides 24 that are used for location of a single daughterboard. Indeed, it would be possible to employ card guides having different forms of location element at each end, so that only one design of card guide is required but the particular form of location element that is employed on the card guide will be determined by its orientation.

After the motherboard has been inserted into engagement with the card guides 24', it can be secured by screwing it into the front plate 36 of the housing for the daughterboards by means of screws 28. Any slight movement of the card guides 24 with respect to the front plate 36 by virtue of this operation will not affect alignment with the motherboard since all the card guides 24 will move together with the motherboard.

It is not necessary for the pins 32 to be mounted on the motherboard and the recesses 34 to be located in the card guides. The pins 32 may instead be located on the card guides and the motherboard may be provided with upstanding posts or other protuberances that have recesses in their front surfaces (i.e. in the direction of insertion) in order to locate the motherboard with respect to the card guides. The particular form of the location elements is not critical to the invention, but they should be arranged so that they can be brought into engagement by sliding the motherboard in the direction of insertion thereof into the frame and can be disengaged by sliding the motherboard in the direction of removal from the frame. In addition, it is not essential for the location elements to be mounted directly on the motherboard 16. They could, for example, be mounted on the tray-shaped holder 18 for the motherboard, but it will be appreciated that this will add the tolerance of the motherboard in the holder to the alignment of the motherboard and the card guides.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An electronics assembly which comprises:
   (i) a frame;
   (ii) a motherboard that is removable from the frame;
   (iii) one or more daughterboards that extend in a plane generally perpendicular to the plane of the motherboard; and
   (iv) a plurality of elongate guides for the daughterboards to enable each daughterboard to be moved toward the motherboard into engagement therewith and away from the motherboard out of engagement therefrom;
   wherein the motherboard has at least one location element thereon, which engages a corresponding location element on at least one of the elongate guides in order to locate the guides and the motherboard with respect to one another.

2. An assembly as claimed in claim 1, wherein the motherboard has at least two location elements thereon, each of which can engage one of the elongate guides in order to locate the guides and the motherboard with respect to one another.

3. An assembly as claimed in claim 2, wherein the or each location element stands up from the printed circuit board forming the motherboard so that it can engage its guide but the guides will allow the motherboard to be removed from, or inserted in, the frame.

4. An assembly as claimed in claim 1, wherein the motherboard can be removed from, or inserted in, the frame by movement in its own plane.

5. An assembly as claimed in claim 4, wherein the motherboard is located in a tray shaped holder that can be slid into and out of the frame.

6. An assembly as claimed in claim 1, wherein the or each location element on the motherboard is in the form of a protuberance that engages a recess in a respective one of the guides.

7. An assembly as claimed in claim 1, wherein the motherboard has two location elements thereon, and engagement of one location element on the motherboard with its corresponding guide limits the relative movement of the motherboard and the guides in the insertion direction of the motherboard, and engagement of the other location element and its corresponding guide prevents rotation of the motherboard relative to the guides about an axis normal to the motherboard and passing through the said one location element.

8. An assembly as claimed in claim 1, wherein engagement of one location element on the motherboard with the corresponding guide will prevent relative movement of the motherboard and the guides in two perpendicular directions.

9. An assembly as claimed in claim 1, wherein the motherboard is located within the frame substantially horizontally.

10. An assembly as claimed in claim 9, wherein the motherboard is located within the frame beneath the daughterboards.

11. An assembly as claimed in claim 1, which is located in a cabinet and can be removed therefrom as a single unit.

12. An electronics assembly which comprises:
    (i) a frame;
    (ii) a motherboard that is removable from the frame;
    (iii) one or more daughterboards that extend in a plane generally perpendicular to the plane of the motherboard; and
    (iv) a plurality of elongate guides for the daughterboards to enable each daughterboard to be moved toward the motherboard into engagement therewith and away from the motherboard out of engagement therefrom;
    wherein the motherboard has at least one location element thereon, which engaged one of the elongate guides in order to locate the guides and the motherboard with respect to one another; and
    wherein at least one of the guides, which is in a position corresponding to the position of the or each location element on the motherboard, extends toward the plane of the motherboard more than other guides.

13. A frame for an electronics assembly which comprises:
    (i) a location in which a planar motherboard can be received;
    (ii) a plurality of guides that extend in a direction generally normal to the plane of the motherboard when it is received in the frame in order to enable a plurality of daughterboards to be located in the frame in engagement with the motherboard, at least one of the guides having a location element thereon that engaged a corresponding location element on a motherboard in order to locate the guides and the motherboard with respect to one another; and
    wherein at least one of the guides extends closer toward the location for receiving the motherboard than the other guides.

14. A frame as claimed in claim 13, wherein at least two of the guides have a location element thereon.

15. A frame as claimed in claim 13, wherein the location for receiving a motherboard allows the motherboard to be inserted therein in a direction in a plane of the motherboard.

16. A frame as claimed in claim 13, wherein the or each location element in the guides comprises a recess that can accommodate a protuberance on the motherboard.

17. A frame as claimed in claim 13, wherein the location for receiving the motherboard will allow the motherboard to be received substantially horizontally.

18. A frame as claimed in claim 13, wherein the location for receiving the motherboard will allow the motherboard to be located within the frame beneath the guides.

19. A method of installing a motherboard in a frame for an electronics assembly comprising a plurality of guides for daughterboards, the guides extending generally normal to the plane of the motherboard, which method comprises:
    (i) sliding the motherboard into the frame; and
    (ii) causing a location element on the motherboard to engage a corresponding location element on at least one of the guides in order to locate the guides and the motherboard with respect to one another.

20. A method as claimed in claim 19, wherein the motherboard has at least two location elements thereon, and each location element on the motherboard engages a corresponding location element on a different guide.

21. A method as claimed in claim 19, wherein the motherboard is slid into the frame in its own plane.

22. A method as claimed in claim 19, wherein the motherboard is slid into the frame in a horizontal plane.

23. A method as claimed in claim 19, which includes sliding one or more daughterboards toward the motherboard and into engagement therewith.

* * * * *